United States Patent [19]

Kibbish

[11] 4,027,093

[45] May 31, 1977

[54] INGOT GRIPPER ASSEMBLY

[75] Inventor: Frank M. Kibbish, Santa Rosa, Calif.

[73] Assignee: Optical Coating Laboratory, Inc., Santa Rosa, Calif.

[22] Filed: Mar. 1, 1976

[21] Appl. No.: 662,738

[52] U.S. Cl. .................................... 13/31; 13/16; 294/102 A

[51] Int. Cl.² .......................................... H01J 37/30

[58] Field of Search .................... 13/1, 9, 14–17, 13/18, 31; 294/100, 102 A

[56] References Cited

UNITED STATES PATENTS

| | | | |
|---|---|---|---|
| 3,215,974 | 11/1965 | Wooding | 13/16 X |
| 3,293,347 | 12/1966 | Wooding | 13/14 |
| 3,666,868 | 5/1972 | Pusche et al. | 13/15 |

*Primary Examiner*—R. N. Envall, Jr.
*Attorney, Agent, or Firm*—Flehr, Hohbach, Test, Albritton & Herbert

[57] ABSTRACT

An ingot gripper assembly for use in gripping an ingot which is substantially cylindrical in shape and having a base with an upwardly and downwardly inclined surface and being provided with an opening which extends to the inclined surface. First and second spaced apart pairs of spaced apart pins are carried by the base and extend upwardly from the inclined surface. A ball is disposed between the first and second pairs of pins and is movable upwardly from the inclined surface and inwardly and outwardly between the first and second pairs of pins. The first and second pairs of pins face each other with the first pair being spaced farther from the cylindrical surface than the second pair. The first pair of pins are inclined sideways in an upward direction. The size of the ball and the spacing between the pins of the second pair being such that when the ball is resting upon the inclined surface, the ball extends into a region defined by an imaginary cylindrical surface coincident with the first named cylindrical surface. The spacing between the first pair of pins is such that when an ingot is disposed in said opening, said ball engages said ingot and engages said first pair of pins. The ingot is free to move upwardly through the opening but is restrained in downward movement by the ball engaging the ingot and frictionally engaging the same to prevent substantial downward movement of the ingot.

8 Claims, 5 Drawing Figures

U.S. Patent   May 31, 1977   4,027,093
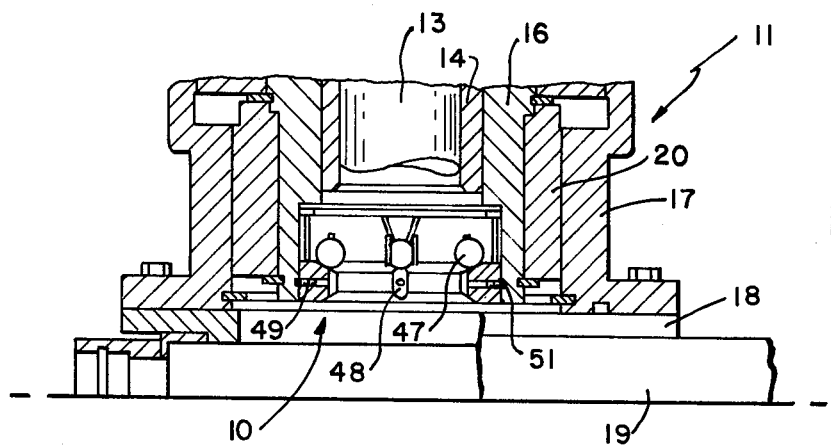
FIG.—1
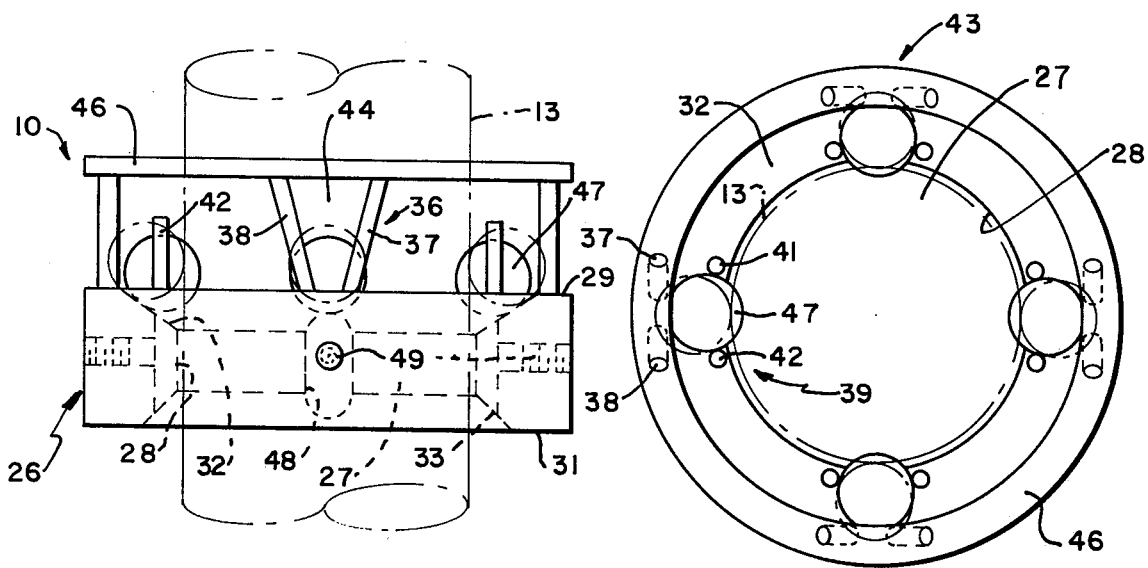
FIG.—2
FIG.—3
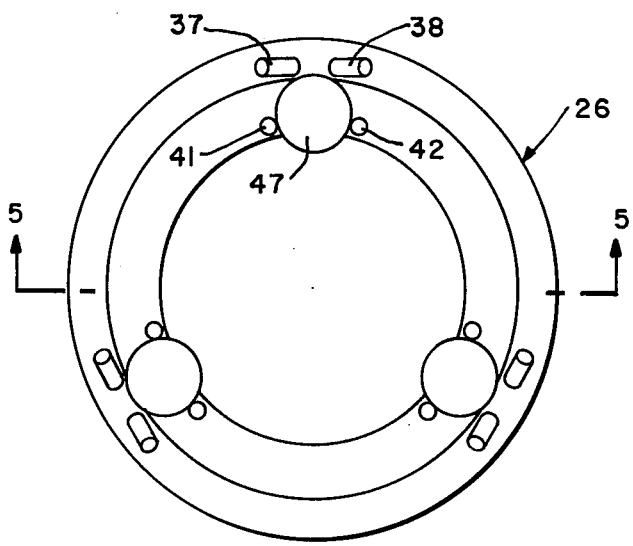
FIG.—4
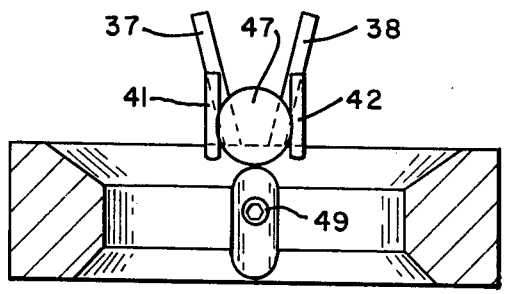
FIG.—5

INGOT GRIPPER ASSEMBLY

BACKGROUND OF THE INVENTION

In application Ser. No. 574,300 filed May 5, 1975 there is disclosed a vapor deposition apparatus. In U.S. Pat. No. 3,619,840 there is disclosed an evaporation source for utilization in the vapor deposition apparatus. Ingot gripping means was provided in said evaporation source which is to prevent the ingot from dropping out of the evaporation source when the evaporation source was being reloaded with a new ingot. In the vapor deposition apparatus disclosed in said copending application, it is very desirable that the apparatus operate as continuously as possible so as to increase its capacity. In the operation of such apparatus continuously, it has been found that the ingot grippers heretofore utilized became clogged up with the coating material utilized which caused excessive wear of the parts of the gripper assembly to cause their failure to operate satisfactorily. A number of different types of gripping assemblies have been utilized, but they have all been characterized by excessive wear and subsequent failure. Such failure was very disadvantageous because it would require the entire automatic vapor deposition apparatus to be shut down to make repairs to the ingot gripping assembly. In addition, in the ingot gripper assemblies heretofore utilized, material from the ingots which would chip off the ingot would fall into the ingot gripper assembly and prevent it from operating properly. There is therefore a need for a new and improved gripper assembly.

SUMMARY OF THE INVENTION AND OBJECTS

The ingot gripper assembly is for use in gripping an ingot of material. The ingot gripper assembly has a substantially cylindrical shape and comprises a base having an upper inwardly and downwardly inclined surface and a cylindrical opening defined by a cylindrical surface extending through the inclined surface. First and second spaced apart pairs of spaced apart pins are carried by the base and extend upwardly from said inclined surface. A ball is disposed between the first and second pairs of pins and is movable upwardly from the inclined surface and inwardly and outwardly between said first and second pairs of pins. The first and second pairs of pins face each other with the first pair being farther from the cylindrical surface than said second pair of pins. The first pair of pins is inclined sideways in an upward direction. The size of the ball and the spacing between the pins of the second pair is such that when said ball is resting upon said inclined surface, the innermost peripheral surface of the ball extends into the region defined by an imaginary cylindrical surface extending beyond and coincident with the first named cylindrical surface. The spacing between the first pair of pins is such that when an ingot is disposed in said opening, the ball engages the ingot and the ball engages the first pair of pins. An ingot disposed in the opening is free to move upwardly through the opening but is restrained in downward movement through the opening by the ball engaging the ingot and frictionally engaging the same to prevent substantial downward movement of the ingot.

In general, it is an object of the present invention to provide an ingot gripper assembly which is capable of permitting the ingot to be advanced upwardly through the opening but to prevent downward movement of the ingot which will be relatively trouble free for a long period of time.

Another object of the invention is to provide as assembly of the above character which is relatively trouble free and which can operate for long period of time in adverse environments.

Another object of the invention is to provide an assembly of the above character which can be readily maintained and repaired.

Another object of the invention is to provide an assembly of the above character which is relatively simple with few parts.

Another object of the invention is to provide an assembly of the above character which is particularly adapted for use in a coating machine.

Additional objects and features of the invention will appear from the following description in which the preferred embodiment is set forth in detail in conjunction with the accompanying drawings.

BRIEF DESCRIPTION OF THE DRAWINGS

FIG. 1 is a cross-sectional view showing an ingot gripper assembly incorporating the present invention mounted in a spindle assembly for use in a vacuum deposition apparatus.

FIG. 2 is an enlarged front elevational view of the ingot gripper assembly shown in FIG. 1.

FIG. 3 is a top plan view of the ingot gripper assembly shown in FIG. 2.

FIG. 4 is a top plan view of another embodiment of the ingot gripper assembly of the present invention.

FIG. 5 is a cross-sectional view taken along the line 5—5 of FIG. 4.

DESCRIPTION OF THE PREFERRED EMBODIMENT

The ingot gripper assembly 10 of the present invention is shown mounted in a spindle assembly 11 which is of a type described in U.S. Pat. No. 3,619,840. As described therein, the spindle assembly is a part of an evaporation source which is utilized in a vapor deposition apparatus of the type described in copending application Ser. No. 574,300 filed May 5, 1975. As described in said patent, means is provided for continuously advancing an ingot through the ingot gripper and through the spindle assembly to provide material for the evaporation source. When it is desired to place another ingot in the evaporation source, the ingot gripper assembly is utilized to prevent the ingot which is already in the spindle assembly from dropping out of the spindle assembly.

As described in said U.S. Pat. No. 3,619,840, the spindle assembly 11 includes a spindle 14 which is carried by a hub 16. The hub 16 is rotatably mounted in a lower collar 17 by a bearing 20 which is secured to a ring 18 mounted upon a housing 19 which includes means (not shown) for advancing the ingot 13 up through the spindle assembly 11 as described in said U.S. Pat. No. 3,619,840.

The ingot gripper assembly 10 consists of a base 26 which has a generally cylindrical configuration and which is provided with a hole or bore 27 centrally disposed therein which is defined by cylindrical surface 28. The base is provided with upper and lower surfaces 29 and 31 which extend at right angles to the cylindrical surface 28. In addition, the base 26 is provided with upper and lower inclined surfaces 32 and 33. The upper inclined surface 32 is inclined inwardly and downwardly whereas the lower inclined surface 33 is inclined inwardly and upwardly.

A plurality of first pairs 36 of spaced apart pins 37 and 38 are carried by the base. In addition, a plurality of second pairs 39 of spaced apart pins 41 and 42 are also carried by the base 26. The first and second pairs of pins 36 and 39 are arranged so that they form sets 43 of pins with a first pair and a second pair forming one set 43 of pins. The first and second pairs of each set are spaced apart with the first pair of each set being spaced farther away from the cylindrical surface 28 than said second pair of each set.

The pins 37 and 38 and 41 and 42 are mounted upon the base in a suitable manner. For example, the pins can be mounted by means of a friction fit in holes (not shown) provided in the base. As can be seen from the drawing, the pins 37 and 38 of the first pairs extend upwardly and sideways from the upper planar surface 29 to provide a generally V-shaped recess 44 between the same. The upper ends of the pins 37 and 38 retained in a retaining ring 46 which lies in a plane parallel to the upper surface 29. The pins 41 and 43 extend upwardly from the upper inclined surface 32 and extend generally in a vertical direction. As will be noted, the pins 41 and 42 extend upwardly for a distance which is only approximately one-half the distance which the pins 37 and 38 extend upwardly.

A ball 47 is disposed between each set of pins. The ball 47 and the spacing between the second set of pins 41 and 42 is such that when the ball is resting upon the upwardly inclined surface, the innermost peripheral surface of the ball 47 extends into a region defined by an imaginary cylindrical surface coincident with the first named cylindrical surface and extending from the same. Also it will be noted that the space between the upper ends of the pins 41 and 42 and the top of the ring 44 is such as to permit the balls 47 to be inserted down between the first and second sets of pins of each set. A plurality of notches or slots 48 are provided in the base 26 and extend generally in a vertical direction and open out through the cylindrical surface 28. As can be seen, the notches 48 have a width slightly less than the spacing between the second pairs of pins 41 and 42 and are disposed between the pins 41 and 42 so that the slot or notch 48 generally underlies the ball provided with these pins but has a size which is insufficient to permit the ball to drop therethrough.

A plurality of allen head screws 49 are provided in the base and extend through the base and into the notches 48 at right angles to the cylindrical surface 28. The allen head screws 49 are accessible through the notches 48 and are adapted to be advanced through the base 26 and to seat within an annular recess 51 provided in the inner lower extremity of the spindle 14.

It can be seen that the ingot gripper assembly 10 can be readily inserted into the lower end of the spindle assembly merely by inserting the same into the spindle assembly as shown and then by advancing screws 49 into the annular recess 51 provided in the spindle 14.

Operation and use of the ingot gripper assembly may now be briefly described as follows. Let it be assumed that the ingot gripper assembly 10 has been mounted in the spindle assembly 11 as hereinbefore described. Let it also be assumed that an ingot 13 is being advanced through the ingot gripper assembly 10 and through the spindle assembly 11 by advancing means provided within the housing 19. Let it also be assumed that it is desired to place another ingot in position so that it can be advanced through the ingot gripper assembly 10. In this case, the means for advancing the ingot is retracted to release the ingot 13. This means that the ingot 13 will be pulled downwardly by the force of gravity and will frictionally engage the balls 47 which will in turn frictionally engage the pins 37 and 38 disposed in a V-shaped configuration to clamp the ingot between the balls 47 and to thereby prevent the ingot from slipping downwardly into the housing 19.

From the construction shown it can be seen that the ingot is free to advance upwardly through the ingot gripper assembly because as the ingot 13 is moved upwardly, the balls 47 will also be moved upwardly in the vees formed by the pins 37 and 38 to permit relatively free movement of the ingot upwardly in the spindle assembly.

It has been found that the ingot gripper assembly is very efficacious. The balls give little or no hindrance to movement of the ingot in an upward direction. However, if the upward force is removed, the ingot would tend to drop and as it does so, the balls follow with it and drop into a wedging position between the back or first pairs of pins forming the vees 44 and thereby hold the ingot in position for reloading of another ingot into the evaporation source.

By the utilization of a plurality of balls, it can be seen that the ingot gripper apparatus will self-align the ingot. The ingot gripper apparatus also makes it possible to utilize ingots of various sizes.

As explained above, the ingot gripper assembly operates in an adverse environment, such as high temperature and is exposed with coating vapors and the like.

Since the ingot gripping apparatus is formed of very few parts, there are very few parts on which coating material can be deposited. Even if coating material is deposited on the parts, the coating will not adversely affect the operation nor will it substantially decrease the lifetime of the ingot gripping assembly. In addition, by providing the slots or notches 48 immediately below the balls 47, it is insured that the balls 46 will be free to move. Thus, any material which should attempt to collect below the balls will drop downwardly through the notches 48 immediately below the ball. The upper inclined surface which is provided insures that the ball will by force of gravity will move inwardly toward the second or front pairs of pins.

It has been found that the ingot gripper assembly can be utilized for long periods of time without maintenance or repairs. This is particularly advantageous in continuous coating apparatus such as disclosed in copending application Ser. No. 574,300 filed May 5, 1975 in which it is desired to keep the coating apparatus operating continuously.

Another embodiment of the invention is shown in FIGS. 4 and 5 which is similar to that shown in FIGS. 2 and 3 with the exception that the retaining ring 44 has been eliminated and three sets of pins rather than four sets of pins equally spaced around the base. As shown in FIGS. 4 and 5, the ingot gripper assembly is substantially identical. It has been found that the pins 37 and 38 forming the first pairs of pins have sufficient rigidity in and of themselves without the retaining ring 44. In addition, the elimination of the retaining ring eliminates one additional part. It also eliminates a part which can be coated with material during operation of the vapor deposition apparatus.

The ingot gripper assembly shown in FIGS. 2 and 3 and 4 and 5 can be formed of any suitable material.

However, it has been found that the base, the pins 37 and 38, the pins 41 and 42 and the ball 46 can be formed of a suitable material such as steel.

The operation of the ingot gripping assembly shown in FIG. 4 is substantially identical to that hereinbefore described in conjunction with FIGS. 1, 2 and 3.

In connection with the foregoing as hereinbefore explained, it can be seen that in FIGS. 2 and 3, four sets of pins are provided whereas in FIGS. 4 and 5 only three sets of pins are provided. It should be appreciated that if desired, even a fewer number of sets of pins can be provided as for a single set and still accomplish the desired results of the present invention.

From the foregoing, it can be seen that there has been provided a relatively simple and inexpensive ingot gripper assembly which has many advantageous features. It is relatively maintenance and trouble free. It can operate in adverse environments for relatively long periods of time. It can be manufactured economically and it can be readily installed in new and pre-existing spindle assemblies.

What is claimed is:

1. In an ingot gripper assembly for use in gripping an ingot of material which has a substantially cylindrical shape, a base having an upper inwardly and downwardly inclined surface and a cylindrical opening defined by a cylindrical surface extending through the inclined surface, first and second spaced apart pairs of spaced apart pins carried by said base and extending upwardly from said base and forming a set of pins, a ball disposed in said set of pins between said first and second pairs of pins and movable upwardly from an inclined surface and inwardly and outwardly between said first and second pairs of pins, said first and second pairs of pins facing each other with the first pair being spaced farther from said cylindrical surface than said second pair, the sides of said ball and the spacing between the pins of said second pair being such that when said ball is resting upon said upper inclined surface the innermost peripheral surface of the ball extends into a region defined by a cylindrical surface coincident with the first named cylindrical surface, the spacing between the first named pair of pins being such that when an ingot is disposed in said ingot gripper assembly, said ball engages the ingot and engages said first pair of pins whereby the ingot is free to move upwardly through the opening in the ingot gripper assembly but is restrained in downward movement in the ingot gripper assembly by said ball engaging said ingot and said first pair of pins to prevent substantial downward movement of said ingot.

2. An assembly as in claim 1 wherein said pins of said first pair in combination provide a generally V-shaped recess.

3. An assembly as in claim 2 wherein a downwardly extending slot is formed in said base and extends downwardly from the ball provided between the set of pins.

4. An assembly as in claim 1 wherein a plurality of sets of pins are provided with a ball being disposed in each of said sets.

5. An assembly as in claim 4 wherein three of said sets of pins are provided with a ball in each of said sets of pins.

6. An assembly as in claim 4 wherein four of said sets of pins are provided with a ball in each of said sets.

7. An assembly as in claim 1 together with a retaining ring for retaining the upper ends of said first pairs of pins.

8. An assembly as in claim 1 wherein said second pairs of pins are disposed in a generally vertical direction and wherein said pins of said second pairs of pins have a length which is substantially less than the length than said first pairs of pins.

* * * * *